US012313350B2

(12) United States Patent
Ranjan et al.

(10) Patent No.: US 12,313,350 B2
(45) Date of Patent: *May 27, 2025

(54) VARYING TOPOLOGY HEAT SINKS

(71) Applicant: Hamilton Sundstrand Corporation, Charlotte, NC (US)

(72) Inventors: Ram Ranjan, West Hartford, CT (US); Kimberly R. Saviers, Glastonbury, CT (US); Kathryn L. Kirsch, Manchester, CT (US); Ross K. Wilcoxon, Cedar Rapids, IA (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 196 days.

This patent is subject to a terminal disclaimer.

(21) Appl. No.: 17/657,729

(22) Filed: Apr. 1, 2022

(65) Prior Publication Data

US 2023/0314092 A1  Oct. 5, 2023

(51) Int. Cl.
*F28F 3/12* (2006.01)
*F28F 1/40* (2006.01)
*H05K 7/20* (2006.01)

(52) U.S. Cl.
CPC ............... *F28F 1/40* (2013.01); *F28F 3/12* (2013.01); *H05K 7/20254* (2013.01); *F28F 2215/04* (2013.01); *F28F 2250/102* (2013.01)

(58) Field of Classification Search
CPC ............ H01L 23/3677; H05K 7/20154; H05K 7/20254; F28F 3/12
See application file for complete search history.

(56) References Cited

U.S. PATENT DOCUMENTS 7,667,967 B1  2/2010 Copeland et al.
7,911,790 B2  3/2011 Carter et al.
(Continued)

FOREIGN PATENT DOCUMENTS

CN  112378278 A  2/2021
CN  112966420 A  6/2021
(Continued)

OTHER PUBLICATIONS

Extended European Search Report for EP Application No. 23154045.1, dated Jul. 25, 2023, 8 pages.
(Continued)

*Primary Examiner* — Eric S Ruppert
(74) *Attorney, Agent, or Firm* — Kinney & Lange, P.A.

(57) ABSTRACT

A heat sink with a primary flow volume, an inlet, an outlet, a bottom plate, a top plate, distribution, heat transfer and collector sections, and flow paths between pillars. The inlet cross-section defines the primary flow volume cross-section and the length of the primary flow volume extends into the heat sink at a right angle to the inlet cross-section. The distribution section is proximate to the flow inlet and has distribution pillars extending from the bottom or top plate. The heat transfer section is proximate to the distribution section and has heat transfer pillars extending from the bottom or top plate. The collector section is proximate to the heat transfer section and has collector pillars extending from the bottom or top plate. The distribution cross-section is greater than the heat transfer cross-section which is smaller than the collector cross-section. The outlet and the flow paths extend outside of the primary flow volume.

20 Claims, 15 Drawing Sheets

(56) References Cited

U.S. PATENT DOCUMENTS

| | | |
|---|---|---|
| 8,630,090 B2 | 1/2014 | Sohn et al. |
| 9,084,376 B2 | 7/2015 | Weiss |
| 10,274,264 B2 | 4/2019 | Arik et al. |
| 10,907,500 B2 | 2/2021 | Wong et al. |
| 11,085,700 B2 | 8/2021 | Ranjan |
| 2004/0244947 A1 | 12/2004 | Chen |
| 2008/0066888 A1 | 3/2008 | Tong et al. |
| 2009/0145581 A1 | 6/2009 | Hoffman et al. |
| 2010/0172091 A1 | 7/2010 | Nishiura |
| 2018/0024599 A1 | 1/2018 | Sakata et al. |
| 2020/0080796 A1 | 3/2020 | Dasgupta et al. |

FOREIGN PATENT DOCUMENTS

| | | | | |
|---|---|---|---|---|
| DE | 102011079508 A1 | | 3/2012 | |
| DE | 102016110043 A1 | * | 12/2016 | ......... H01L 23/3677 |
| DE | 102017207361 A1 | | 5/2018 | |
| DE | 202021104673 U1 | | 9/2021 | |
| JP | 2000164773 A | | 6/2000 | |
| KR | 20140085011 A | | 7/2014 | |
| KR | 20210112871 A | * | 9/2021 | |

OTHER PUBLICATIONS

Extended European Search Report for EP Application No. 23154231.7, dated Jul. 25, 2023, 8 pages.

* cited by examiner

VARYING TOPOLOGY HEAT SINKS

STATEMENT OF GOVERNMENT INTEREST

This invention was made with government support under D4840-S1 awarded by the Department of Defense. The government has certain rights in the invention.

CROSS-REFERENCE TO RELATED APPLICATION(S)

This application is related to U.S. application Ser. No. 17/657,728 filed on Apr. 1, 2022, entitled "VARYING TOPOLOGY HEAT SINKS,".

BACKGROUND

In traditional heat sinks, fluid flow is routed through channels, with the flow paths only varying in two dimensions. The fluid enters at an inlet and travels through a channel to an outlet. The flow is constrained by walls, vanes, layers, floors, etc., so that it does not substantially deviate from the location of the inlet and outlet in one direction, typically the Z-direction. While this design is effective at heat transfer, and is simple to manufacture, because it is limited to customization in two directions, opportunities remain for optimizing the designs to fit particular size, weight, and shape specifications. These parameters are particularly important in aerospace applications where size, shape, and weight of individual parts can have an outsized impact on the fuel efficiency and cost of operation of a vehicle or other platform.

SUMMARY

A heat sink with a primary flow volume, a flow inlet, a flow outlet, a bottom plate, a top plate, a flow distribution section, a heat transfer section, a flow collector section, and flow paths. The flow inlet has a primary flow volume cross-section, and length. The flow inlet has an inlet cross-section. The inlet cross-section defines the primary flow volume cross-section and the length of the primary flow volume extends into the heat sink at a right angle to the inlet cross-section. The flow distribution section is proximate to the flow inlet and has distribution pillars extending from the bottom plate or the top plate in a pillar length direction. Each distribution pillar has a distribution cross-section taken perpendicular to the pillar length direction. The heat transfer section is proximate to the flow distribution section and has heat transfer pillars extending from the bottom plate or the top plate in the pillar length direction. Each heat transfer pillar has a heat transfer cross-section taken perpendicular to the pillar length direction. The flow collector section is proximate to the heat transfer section and has collector pillars extending from the bottom plate or the top plate in the pillar length direction. Each collector pillar has a collector cross-section taken perpendicular to the pillar length direction. The flow paths are between the distribution pillars, heat transfer pillars, and collector pillars. The distribution cross-section is greater than the heat transfer cross-section and the collector cross-section is greater than the heat transfer cross-section. The flow outlet and the flow paths extend outside of the primary flow volume.

A method for making the heat sink described above. The method includes first providing the bottom plate, building one or more of the distribution pillars, heat transfer pillars, or collector pillars onto the bottom plate layer by layer using additive manufacturing, providing the exterior wall, attaching the exterior wall to the bottom plate, providing the top plate, attaching the top plate to one or more of the exterior wall, the distribution pillars, the heat transfer pillars, or the collector pillars.

DETAILED DESCRIPTION

The cost of operating an aircraft is highly dependent on the weight and aerodynamics of the craft. As such, it is important to maximize the use of the available space and the efficiency of the parts used. To this end, additive manufacturing allows for heat sinks that route fluid in three dimensions instead of the two used in a traditional layered heat exchanger or vane heat sink. By utilizing three dimensions, as described herein, more compact heat sinks and heat sinks that require less power to move the fluid through them are possible. Additive manufacturing also allows for rapid prototyping and a high degree of customization for individual applications.

The present design utilizes variations in the space between pillar protrusions to create optimal flow paths and increased surface area, which in turn increases the heat exchange efficiency of the heat sink. These pillar protrusions extend in the Z-direction beyond the direct path from the inlet to the outlet, allowing for three-dimensional airflow through the heat sink, rather than the traditional two-dimensional flow through set channels. Utilizing pillars in particular, allows for rapid design and testing, both with software/ artificial intelligence modeling and physical prototyping. One embodiment uses a non-uniform pillar density. Another uses uniform pillar density with non-uniform pillar cross-section area.

The following notation is used throughout the descriptions: the Z-direction refers to the direction which corresponds to the distance from the bottom plate to the top plate and vice versa. The X-direction and the Y-direction are perpendicular to the Z direction and to each other. Where appropriate, the Y-direction is defined as the primary direction of the fluid flow as it enters a heat sink. Cross-sections are taken perpendicular to the Z direction.

Heat transfer surface features are protrusions into the flow space of the heat sink designed to transfer heat from the fluid into the heat sink and/or alter the flow path of the fluid. In some embodiments the heat transfer surface features can be vanes, pillars, or pins. Pillars are discrete heat transfer surface features which are solid, i.e. do not have voids, in the Z-direction, and have their largest dimension in the Z-direction. Pins are pillars with a circular or oval cross-section.

Figure 1:
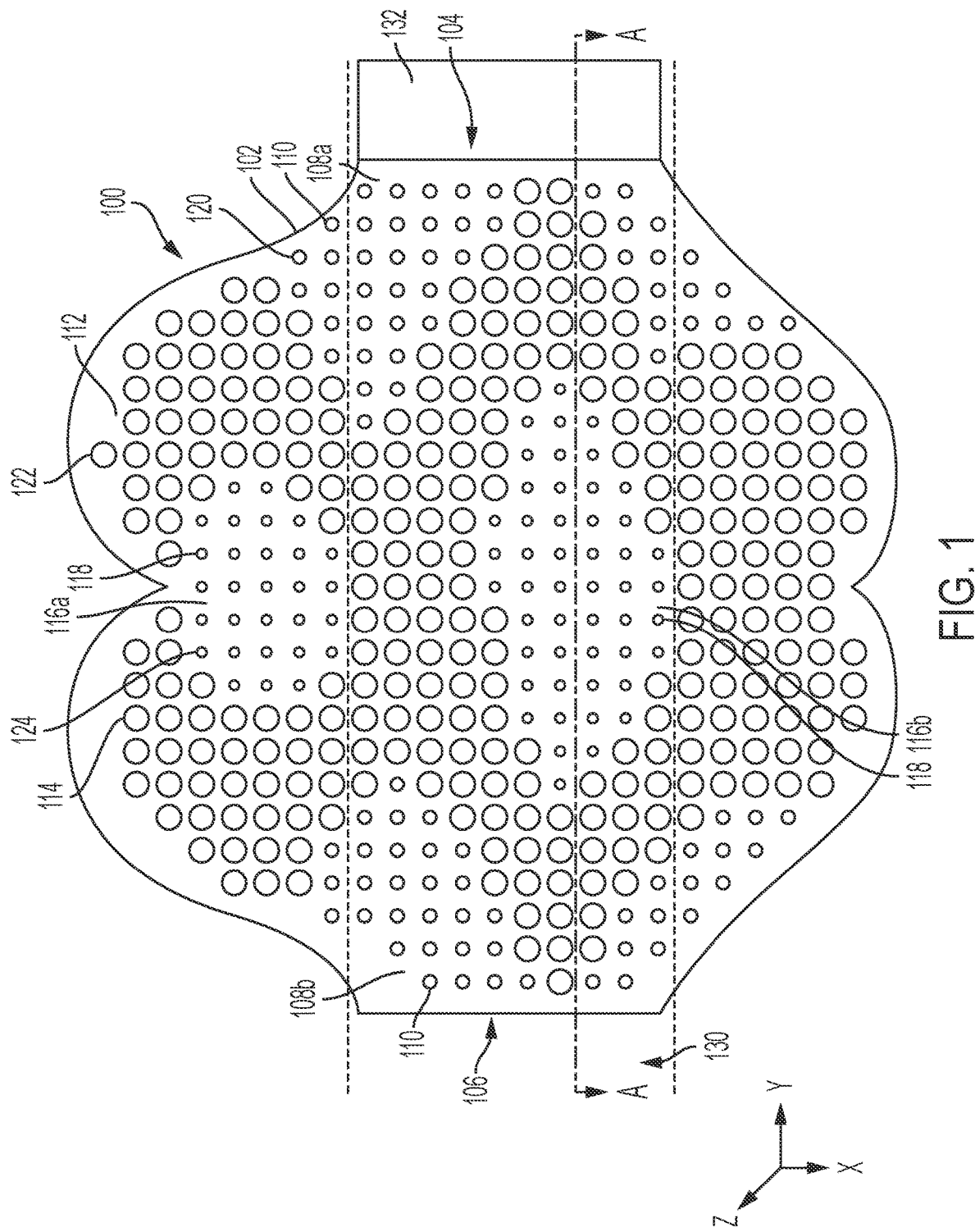
FIG. 1 is a top view of a three-dimensional varying topology heat sink with a uniform pillar density.

FIG. 1 is a top view of a three-dimensional varying topology heat sink with a uniform heat transfer surface feature density. Heat sink 100 includes exterior wall 102, flow inlet 104, flow outlet 106, flow distribution section 108 containing distribution pillars 110, heat transfer section 112 containing heat transfer pillars 114, flow collector section 116 containing collector pillars 118, fluid mover 132, and primary flow volume 130. Each distribution pillar 110 has a distribution pillar cross-section area 120. Each heat transfer pillar 114 has a heat transfer pillar cross-section area 122. Each collector pillar 118 has a collector pillar cross-section area 124.

Primary flow volume 130 is the volume through which fluid would flow were it to follow a substantially straight path after entering the heat sink. In traditional heat sinks, the fluid flow is constrained in at least one direction, i.e. the X- or Z-directions, upon entering the heat sink. Channels and/or vanes are used to direct fluid flow from the inlet to the outlet with heat transfer occurring along the way. In these heat sinks, the flow only has freedom of movement in one (i.e. Y-) or two (i.e. either X- and Y-, or Z- and Y-) directions. Heat sink 100, on the other hand is a three-dimensional (3D) heat sink. The fluid flow is not constrained in the X-, Y-, or Z-directions. The fluid flow, therefore, has freedom of movement in all three dimensions. The fluid flow will substantially deviate from the primary flow volume in both the X- and Z-directions and may enter the heat sink from the Z-direction. Flow distribution section 108 is a region of heat sink 100 primarily designed to direct flow throughout the heat sink. Heat transfer section 112 is a region of heat sink 100 primarily designed to maximize heat transfer. Flow collector section 116 is a region of heat sink 100 primarily designed to create a reservoir for fluid within heat sink 100, in order to limit pressure changes over the heat sink 100. All sections provide some heat transfer.

The outer edge of heat sink 100 is defined by exterior wall 102. Distribution pillars 110, heat transfer pillars 114, and collector pillars 118 are evenly distributed throughout the interior region of heat sink 100, i.e. the number of pillars per square centimeter is consistent throughout the interior region of heat sink 100. In the embodiment pictured, the pillars are arranged in rows and columns, though another even distribution arrangement may be used (for example staggered rows and columns). The exact location, size, and shape of flow distribution section 108, heat transfer section 112, and flow collector section 116 is determined by the desired flow properties. In some embodiments, the ratio of the area of distribution section 108 to the area of heat transfer section 112 is between 20% and 80%, between 25% and 75%, or between 30% and 70%, the ratio of the area of heat distribution section 112 to the area of flow collector section 116 is between 30% and 70%, between 35% and 65%, or between 40% and 60%, and the ratio of the area of flow distribution section 108 to the area of flow collector section 116 is between 30% and 70%, between 35% and 65%, or between 40% and 60%. In some embodiments, flow distribution section 108 is proximate to flow inlet 104 and/or flow outlet 106, heat transfer section 112 is proximate to flow distribution section 108, and flow collector section 116 is surrounded by heat transfer section 112. The exact number of pillars in flow distribution section 108, heat transfer section 112, and flow collector section 116 is determined by the desired flow properties.

Distribution pillar cross-section area 120, heat transfer pillar cross-section area 122, and collector pillar cross-section area 124 are different from each other and are determined based on the desired flow and heat transfer properties of heat sink 100. In some embodiments, the ratio of distribution pillar cross-section area 120 to heat transfer pillar cross-section area 122 is between 20% and 80%, between 25% and 75%, or between 30% and 70%, the ratio of heat transfer pillar cross-section area 122 to collector pillar cross-section area 124 is between 20% and 80%, between 25% and 75%, or between 30% and 70%, and the ratio of distribution pillar cross-section area 120 to collector pillar cross-section area 124 is between 30% and 70%, between 35% and 65%, or between 40% and 60%.

Figure 2:
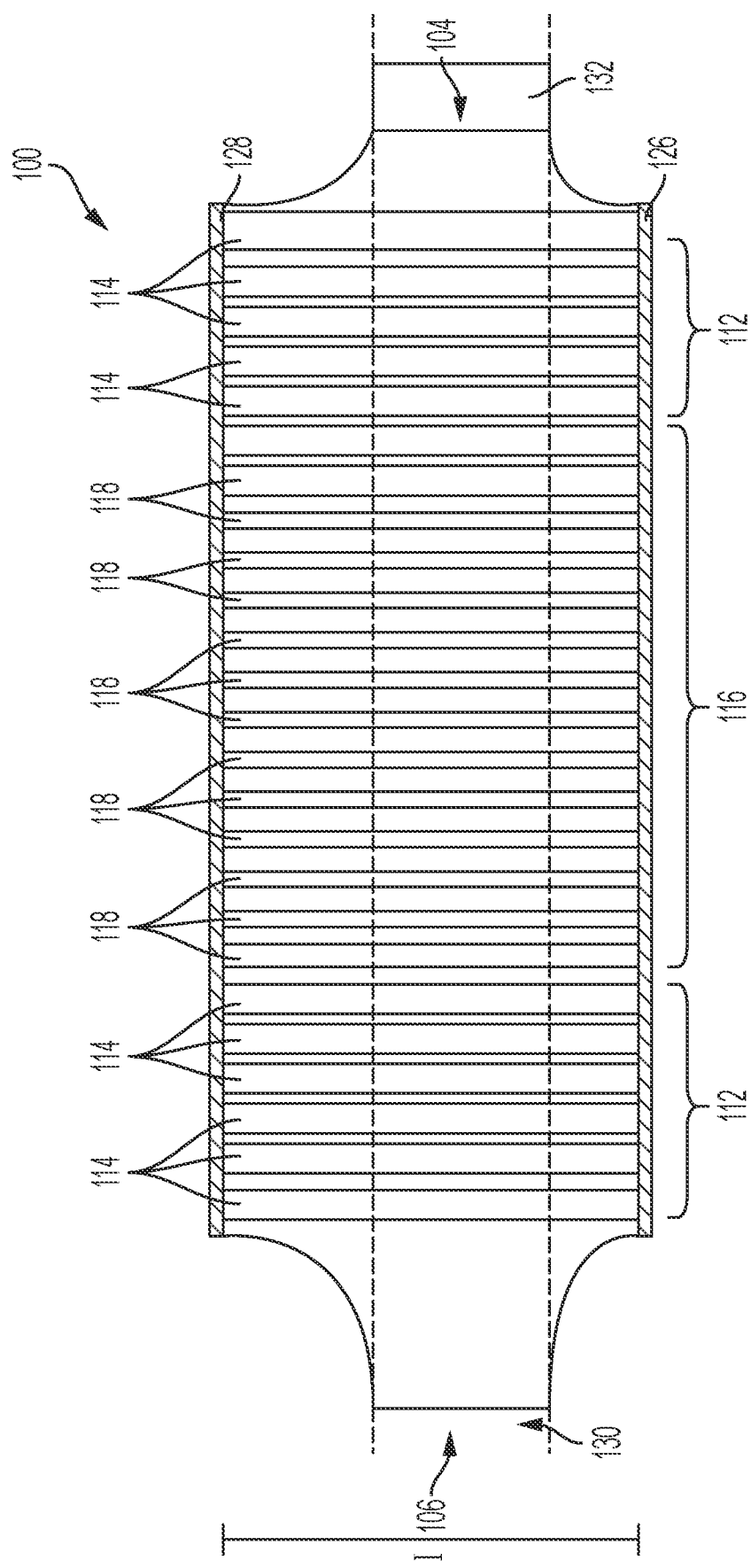
FIG. 2 is a side view of the three-dimensional varying topology heat sink of FIG. 1 taken along line A-A.

FIG. 2 is a side view of the three-dimensional varying topology heat sink of FIG. 2 taken along line A-A. Heat sink 100 includes flow inlet 104, flow outlet 106, bottom plate 126, top plate 128, heat transfer section 112 having heat transfer pillars 114, flow collector section 116 having collector pillars 118, and primary flow volume 130. Each pillar has pillar height H extending in the Z-direction. Distribution pillars 110, heat transfer pillars 114, and collector pillars 118 extend from bottom plate 126 to top plate 128.

Figure 3:
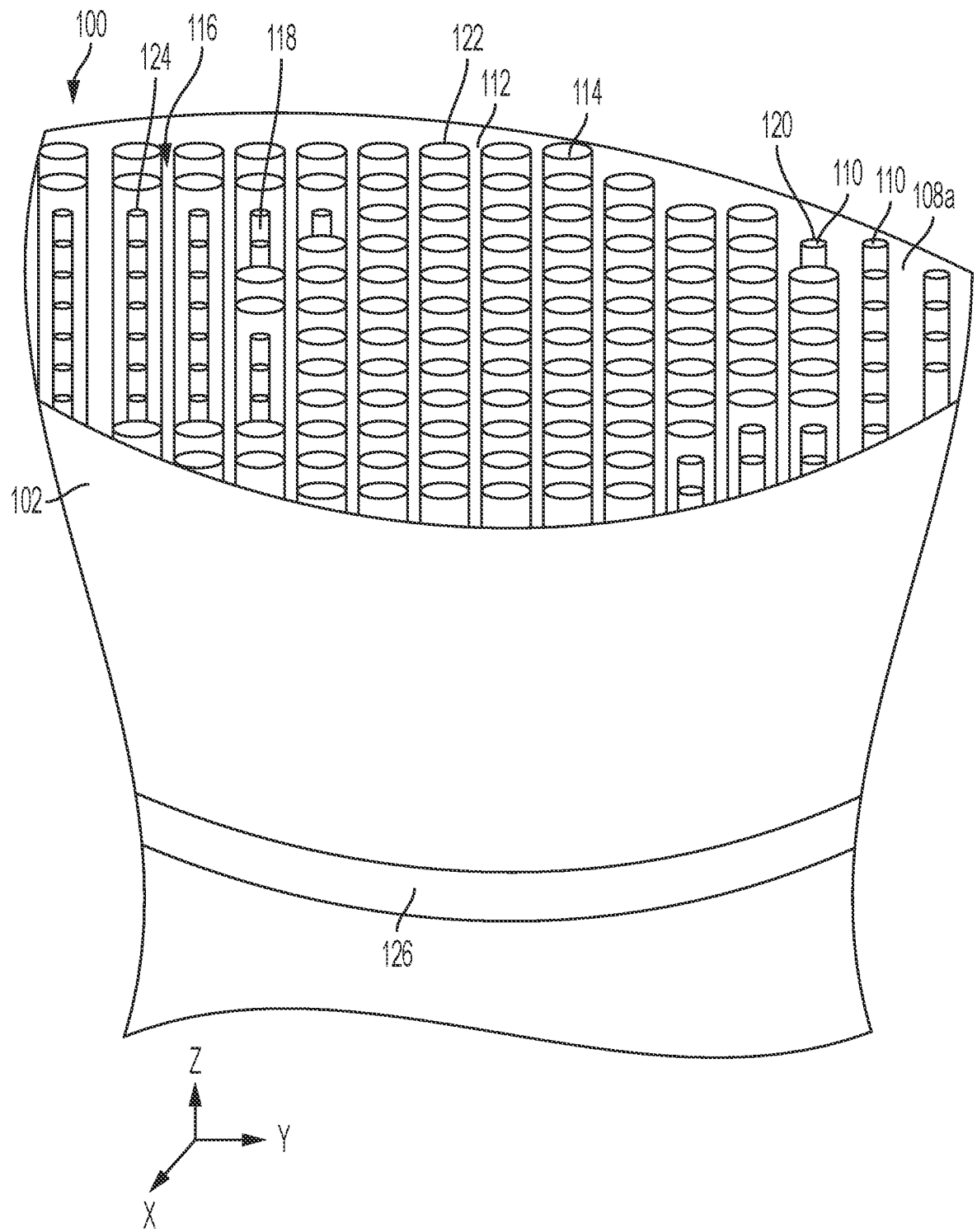
FIG. 3 is a perspective view of the three-dimensional varying topology heat sink of FIG. 1.

FIG. 3 is a perspective view of the three-dimensional varying topology heat sink of FIG. 1. Heat sink 100 of FIG. 3 includes exterior wall 102, flow distribution sections 108a-b, distribution pillars 110 having distribution pillar cross-section area 120, heat transfer section 112, heat transfer pillars 114 having heat transfer pillar cross-section area 122, flow collector section 116, collector pillars 118 having collector pillar cross-section area 124, and bottom plate 126 arranged as described above.

Referring to FIGS. 1-3 as described above, when in use fluid flow is driven by fluid mover 132 and enters through flow inlet 104 to flow distribution section 108a where it meets distribution pillars 110. Distribution pillars 110 direct fluid flow into the other sections and allow for some heat transfer. The fluid flow then enters heat transfer section 112 and meets heat transfer pillars 114. Heat transfer pillars 114 have a larger total surface area than distribution pillars 110, allowing for increased heat transfer. Some of the flow will then be directed into flow collector section 116 and will meet collector pillars 118. The wider flow paths in flow collector section 116 reduce overall pressure drops in the system, reducing the power to fluid mover 132 required to maintain fluid flow. Finally, the fluid flow continues into flow distribution section 108b where it meets more distribution pillars 110, eventually exiting heat sink 100 through flow outlet 106.

Figure 4:
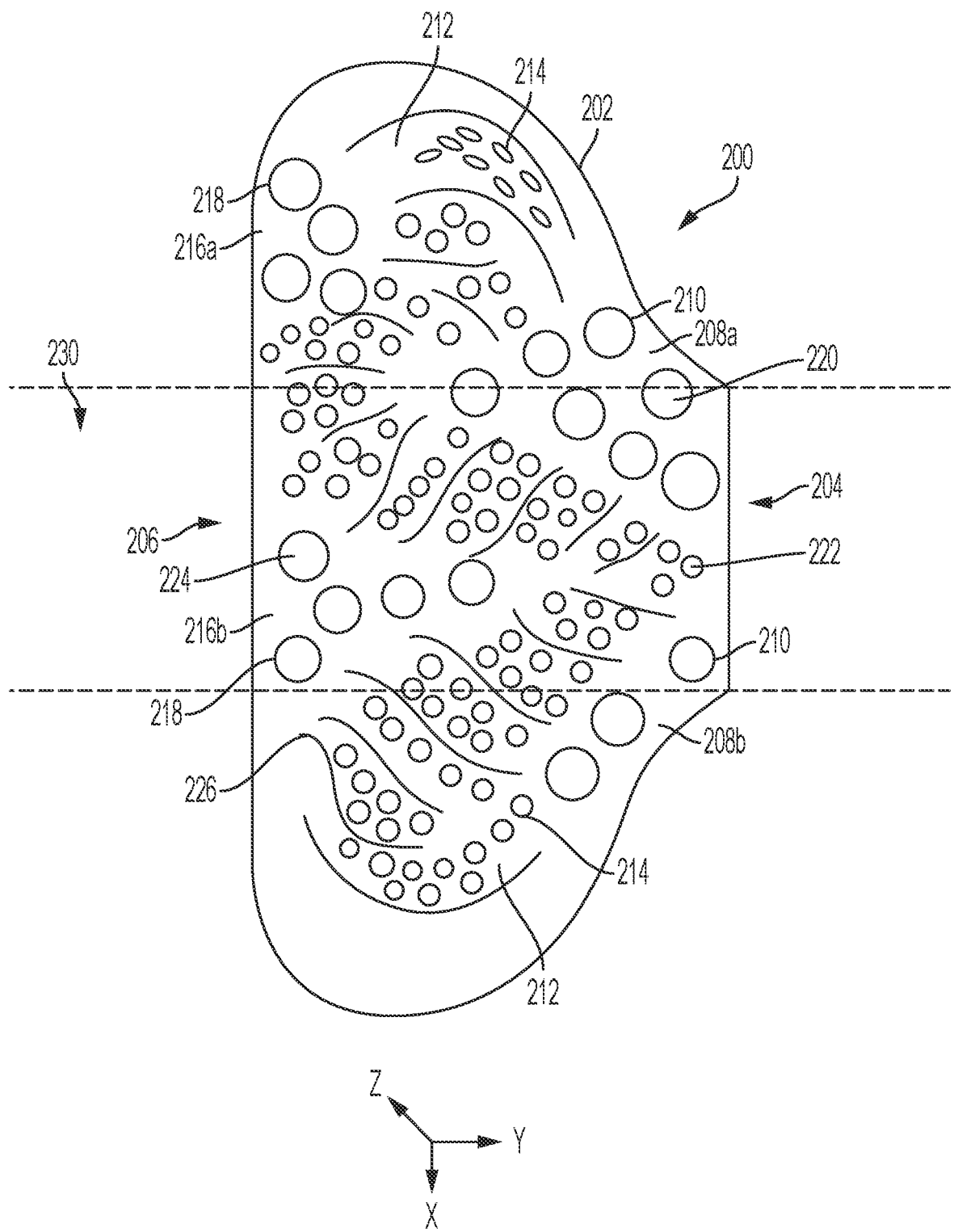
FIG. 4 is a top view of a three-dimensional varying topology heat sink with varying pillar density.
Figure 5A:
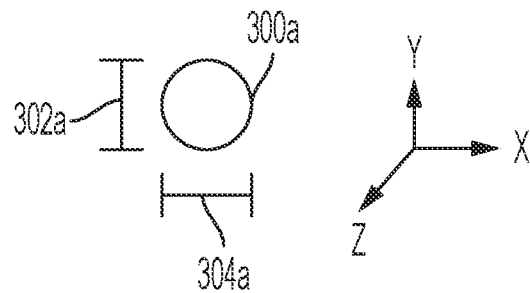
FIGS. 5A-E are cross-sections of example pillars which can be used in a three-dimensional varying topology heat sink.
Figure 5B:
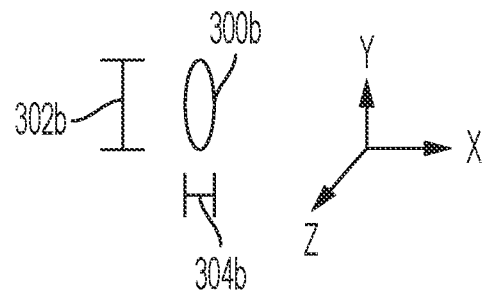
Figure 5C:
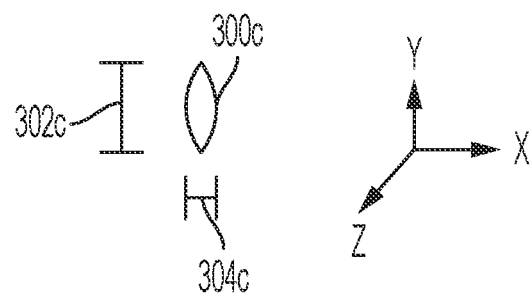
Figure 5D:
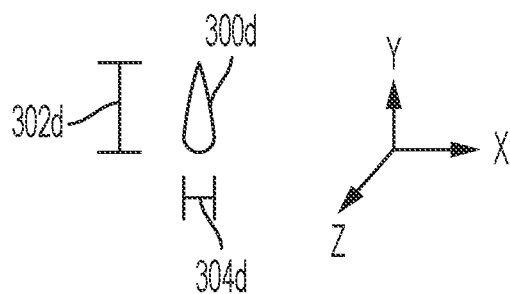
Figure 5E:
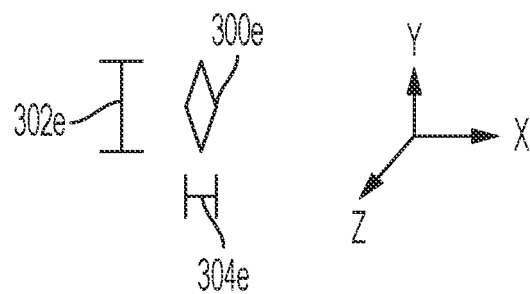
Figure 6A:
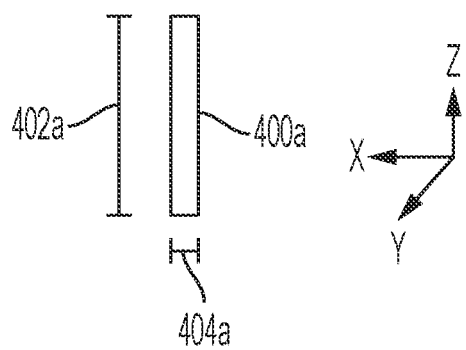
FIGS. 6A-F are side views of example pillars which can be used in a three-dimensional varying topology heat sink.
Figure 6B:
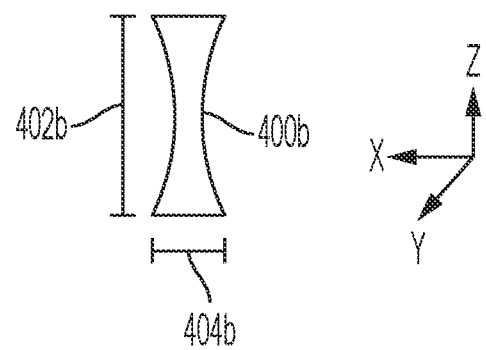
Figure 6C:
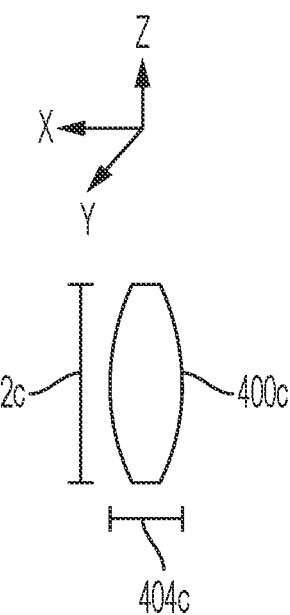
Figure 6D:
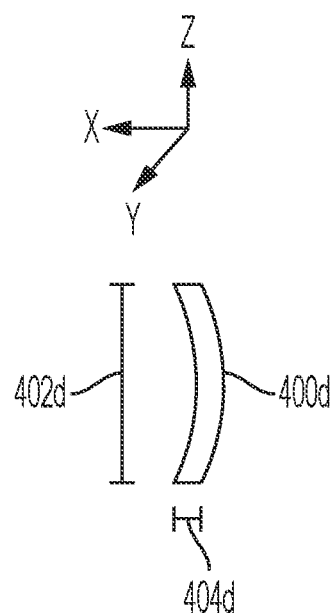
Figure 6E:
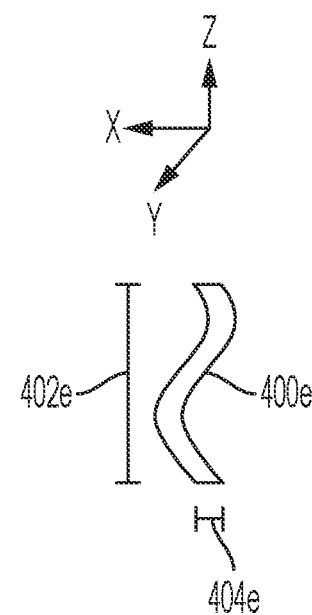
Figure 6F:
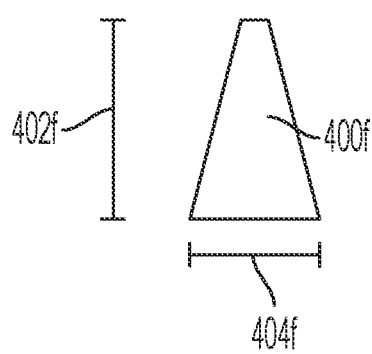

FIG. 4 is a top view of a three-dimensional varying topology heat sink with varying pillar density. Heat sink 200 of FIG. 4 includes exterior wall 202, flow inlet 204, flow outlet 206, flow distribution section 208, distribution pillars 210 having distribution pillar cross-section area 220, heat transfer section 212, heat transfer pillars 214 having heat transfer pillar cross-section area 222, flow collector section 216, collector pillars 218 having collector pillar cross-section area 224, heat transfer vane 226, and primary flow volume 230.

The outer edge of heat sink 200 is defined by exterior wall 202. Fluid flow enters at flow inlet 204 and is able to move throughout heat sink 200, including outside of primary flow volume 230. As it enters heat sink 200, the fluid flow meets flow distribution section 208, proceeds through heat transfer section 212, and then through flow collector section 216, finally exiting through flow outlet 206. Flow distribution section 208 is made up of an irregular density of distribution pillars 210. Flow distribution section 208 directs flow through heat sink 200 and provides some heat transfer. Heat transfer section 212 is made up of an irregular distribution of heat transfer pillars 214 and heat transfer vanes 226 extending from the bottom plate and/or top plate. Heat transfer vanes are thin sheets or ribbons which create fluid flow channels and provide surface area for heat transfer and/or provide support between the top and bottom plates. Heat transfer vanes have a height along the Z-direction, a length along the Y-direction, and a thickness along the X-direction. The thickness is the smallest of the three measurements, with the surface area defined by the height and the length being at least two times the surface area defined by the thickness and the height and/or the thickness and the length. Heat transfer vanes 226 can be straight or curved and may extend the entire distance from the bottom plate to the top plate or only part of the distance. Flow collector section 216 is made up of an irregular distribution of collector pillars 218.

Distribution pillar cross-section area 220, heat transfer pillar cross-section area 222, and collector pillar cross-section area 224 can each be different. In some embodiments, distribution pillar cross-section area 220, heat transfer pillar cross-section area 222, and/or collector pillar cross-section area 224 are the same. This is possible because flow dynamics and heat transfer properties can be optimized by altering the density and distribution of pillars in each section.

FIGS. 5A-E are cross-sections of example heat transfer surfaces which can be used in a three-dimensional varying topology heat sink. In some embodiments, the heat transfer surfaces are pillars. Pillars are protrusions where the height in the Z-direction is at least two times greater than both the length and the thickness. Each generic pillar 300a-e has a generic pillar length 302a-e and generic pillar width 304a-e. Generic pillar length 302a-e is defined as the largest dimension in the XY plane of generic pillar 300a-e. Generic pillar width 304a-e is perpendicular to generic pillar depth 302a-e. When in use in a three-dimensional varying topology heat sink, generic pillar 300a-e is oriented so that generic pillar length 302a-e is along the desired fluid flow direction. Examples of useful cross-section shapes include circle 300a, oval 300b, pointed oval 300c, tear drop 300d, and diamond 300e.

FIGS. 6A-F are side views of example pillars which can be used in a three-dimensional varying topology heat sink. Each generic pillar 400a-f has a generic pillar height 402a-f and generic pillar width 404a-f measured at the point where the pillar contacts the top or bottom plate. Generic pillar 400 can have a number of useful profiles in the Z-direction. Examples of useful profiles include straight 400a, concave 400b, convex 400c, curved 400d, s-shaped 400e, or conical 400f. The cross-sections of FIGS. 5A-E can be combined with the side views of FIGS. 6A-F to form pillars with shapes that vary in the Z-direction.

Figure 7A:
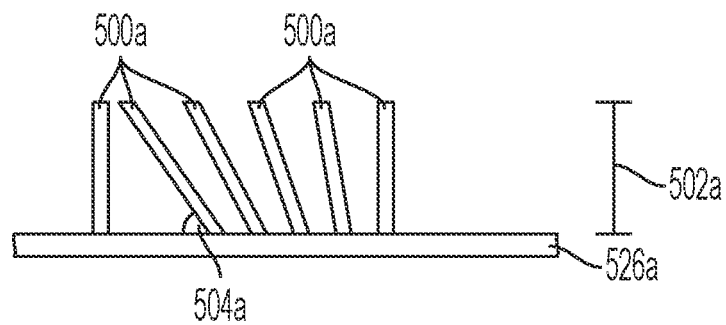
FIGS. 7A-C are side views of example three-dimensional varying topology heat sinks with angled pillars.
Figure 7B:
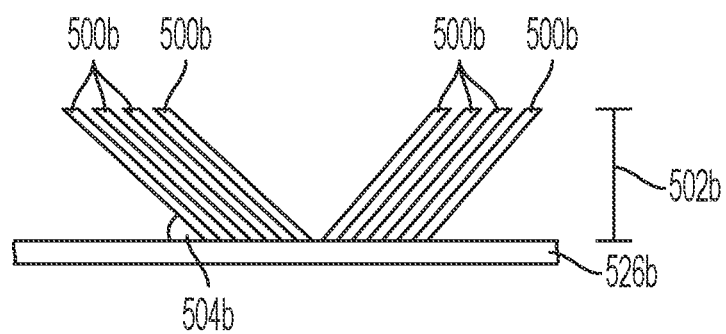
Figure 7C:
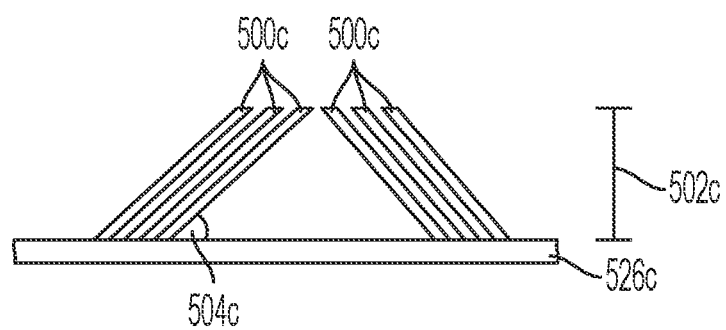

FIGS. 7A-C are side view of possible embodiments of a three-dimensional varying topology heat sink with angled pillars. Generic pillar 500 extends from generic plate 526 to generic pillar height 502. Generic pillar angle 504 is defined as the angle between the tangent of generic pillar 500 and generic plate 526 at the point where generic pillar 500 meets generic plate 526. In some embodiments, for example FIGS. 7B-C, generic pillar angle 504b, 504c is consistent throughout the heat sink. In other embodiments, for example FIG. 7A, generic pillar angle 504a varies throughout the heat sink. In some embodiments, generic pillars 500 may all be angled in the same direction. In other embodiments, generic pillars 500b may lean away from each other, as shown in FIG. 7B, or generic pillars 500c may lean toward each other, as shown in FIG. 7C. Generic pillar angle 504 can be between 30 degrees and 90 degrees, between 35 degrees and 85 degrees, or between 40 degrees and 80 degrees.

Figure 8A:
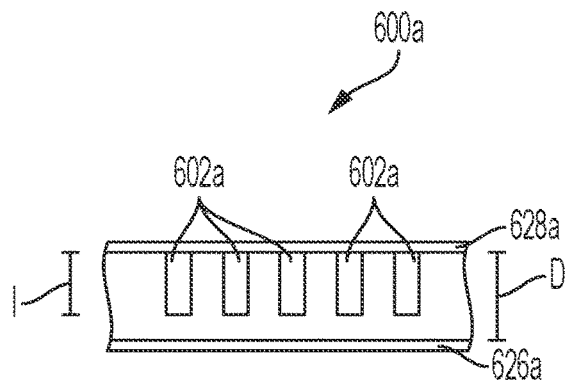
FIGS. 8A-F are side views of example three-dimensional varying topology heat sinks with partial height pillars.
Figure 8B:
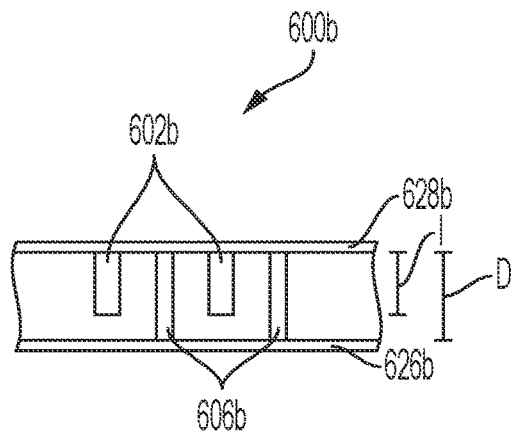
Figure 8C:
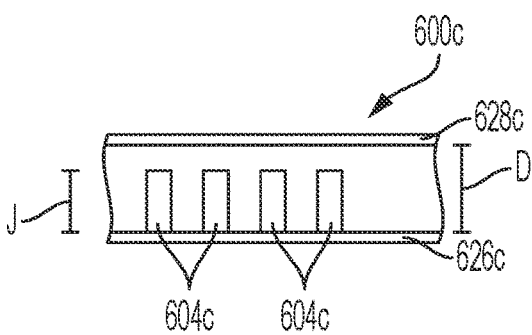
Figure 8D:
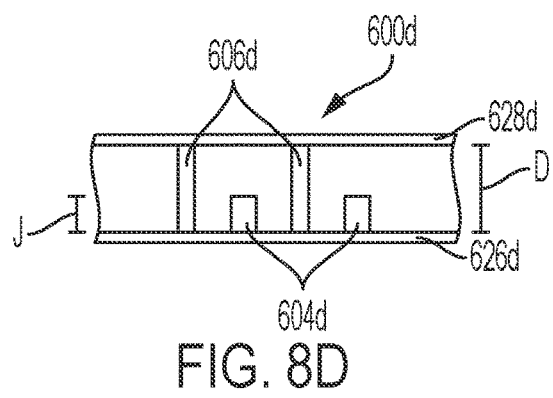
Figure 8E:
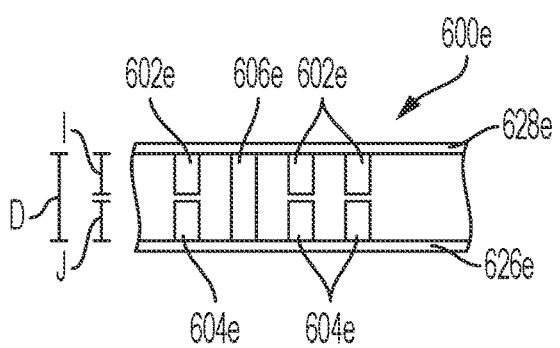
Figure 8F:
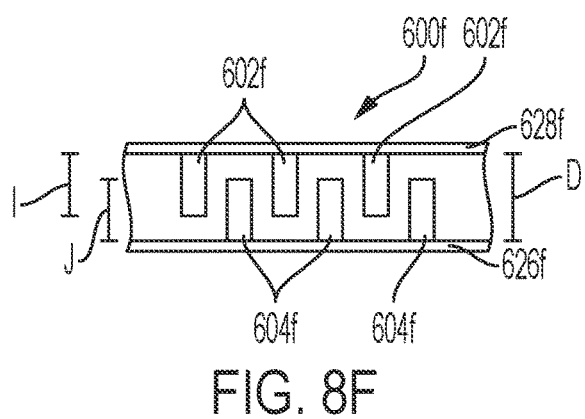
Figure 8G:
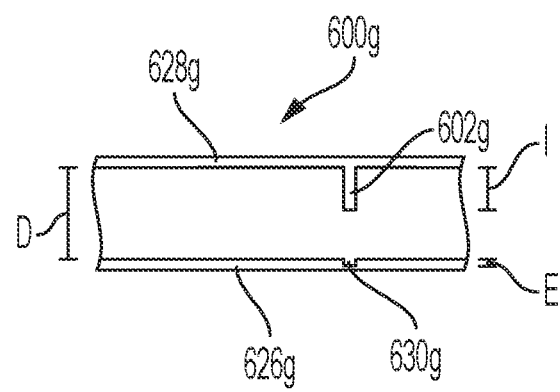
FIGS. 8G and 8H are side views of example three-dimensional varying topology heat sinks with partial height pillars and dimples.
Figure 8H:
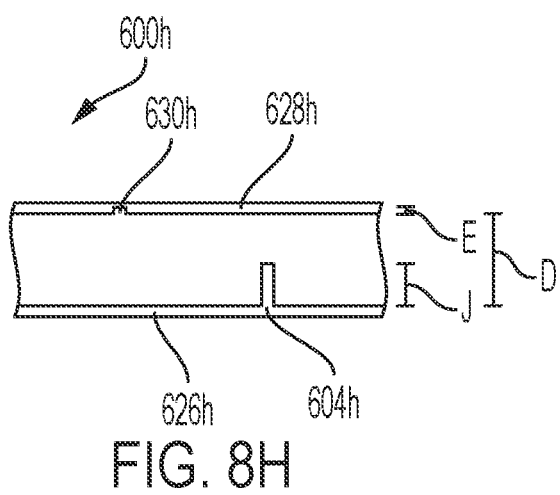

FIGS. 8A-8H will be discussed together. FIGS. 8A-F are side views of possible embodiments of a three-dimensional varying topology heat sink with partial height pillars. FIGS. 8G and 8H are side views of example three-dimensional varying topology heat sinks with partial height pillars and dimples. Embodiments of heat sink 600 include top partial height pillar 602, bottom partial height pillar 604, full height pillar 606, bottom plate 626, top plate 628, top pillar height I, bottom pillar height J, and heat sink span D. Additional embodiments can also include dimple 630 with a dimple depth E. Top pillar height I is the distance that top partial height pillar 602 extends into heat sink 600 from top plate 628. Bottom pillar height J is the distance that bottom partial height pillar 604 extends into heat sink 600 from bottom plate 626. Heat sink span D is the distance between bottom plate 626 and top plate 628. A partial height pillar is a pillar where pillar height I or J is less than heat sink span D. Dimple 630 is a feature recessed into top plate 628 or bottom plate 262.

Heat sinks described herein can have any combination of full height pillars, top partial height pillars, and bottom partial height pillars. For example, in FIG. 8A, heat sink 600a has a number of top partial height pillars 602a extending top pillar height I from top plate 628a toward bottom plate 626a. In FIG. 8B, heat sink 600b has a number of top partial height pillars 602b extending top pillar height I from top plate 628b to bottom plate 626b, along with full height pillars 606b. Top partial height pillars 602 can be between 5% and 95%, between 10% and 85%, or between 20% and 75% of heat sink span D. In FIG. 8C, heat sink 600c has a number of bottom partial height pillars 604c extending bottom pillar height J from bottom plate 626c toward bottom plate 628b. Bottom partial height pillars 604 can be between 5% and 95%, between 10% and 85%, or between 20% and 75% of heat sink span D. In FIG. 8D, heat sink 600d has a number of bottom partial height pillars 604d extending bottom pillar height J from bottom plate 626d toward top plate 628d, along with full height pillars 606d. FIG. 8E shows an embodiment which combines top partial height pillars 602e, bottom partial height pillars 604e, and full height pillars 606e. In heat sink 600e top partial height pillars 602e extend from top plate 628e toward bottom plate 626e to top pillar height I. Bottom partial height pillars 604e extend from bottom plate 626e toward top plate 628e to bottom pillar height J. Top partial height pillars 602e and bottom partial height pillars 604e are aligned. As such, the combination of top pillar height I and bottom pillar height J is still less than heat sink span D, leaving a gap. The gap between top partial height pillar 602e and bottom partial height pillar 604e can be, for example, 0.5% and 25% of heat sink span D. Top pillar height I and bottom pillar height J may be the same or different, depending on the desired flow properties. In FIG. 8F top partial height pillars 602f and bottom partial height pillars 604f are staggered. In a staggered formation, top pillar height I combined with bottom pillar height J can be greater than heat sink span D. Similar to FIG. 8E, pillars in a staggered formation can have a combined top pillar height I and bottom pillar height J that is less than or equal to heat sink span D. Dimples 630 can be aligned with partial height pillars 602, 604 as shown in FIG. 8G or offset from partial height pillars 602, 604 as shown in FIG. 8H. Dimple depth E is the distance from the surface of top or bottom plate 626, 628 to the deepest point of dimple 630.

Figure 9:
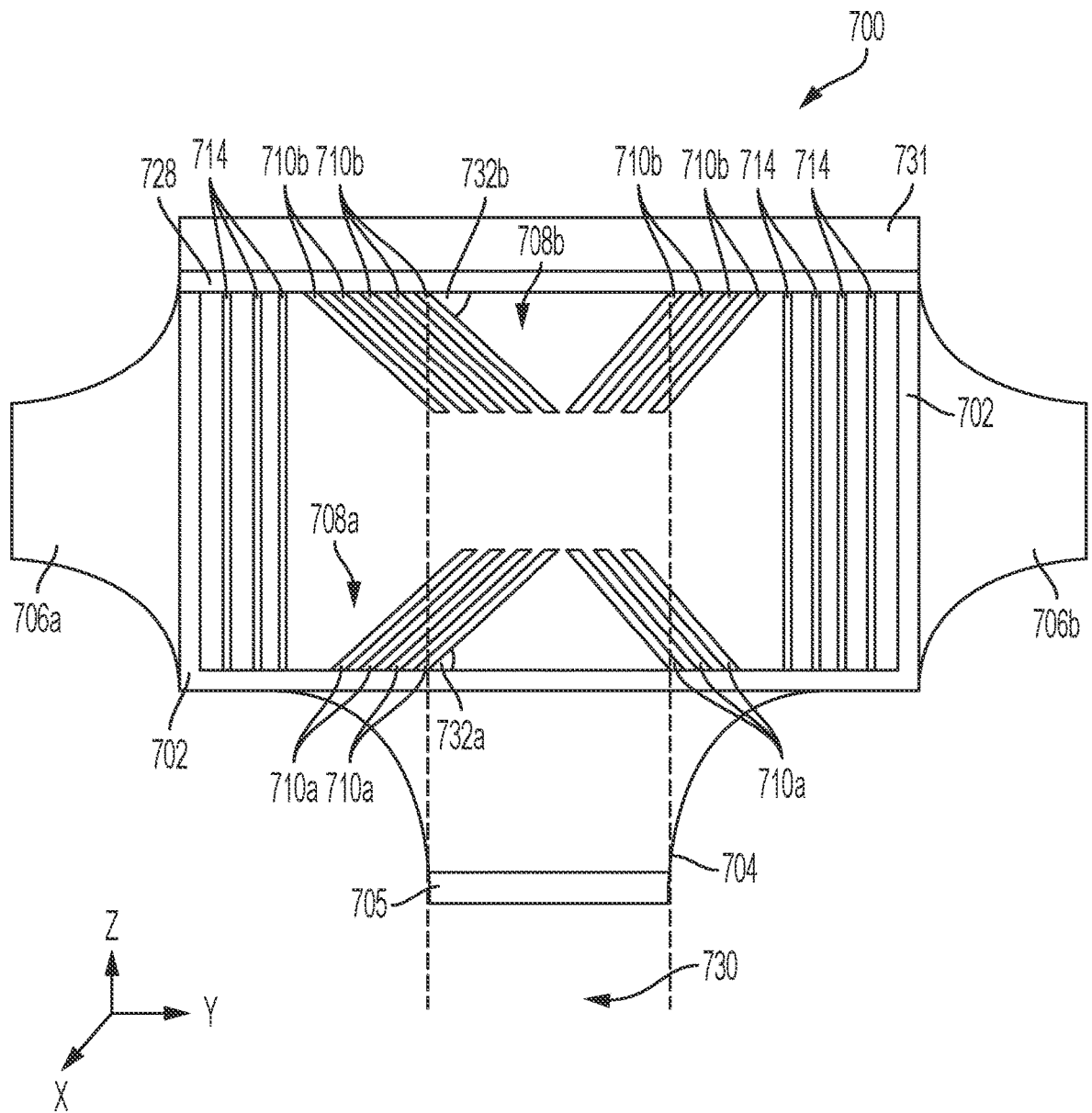
FIG. 9 is a side view of an embodiment of a three-dimensional varying topology heat sink with angled and partial height pillars.

FIG. 9 is a side view of an embodiment of a three-dimensional varying topology heat sink with angled and partial height pillars. Heat sink 700 includes exterior wall 702, flow inlet 704, flow outlet 706, flow distribution section 708 having distribution pillars 710, heat transfer section 712 having heat transfer pillars 722, bottom plate 726, top plate 728, and primary flow volume 730. Some pillars are full height pillars with pillar height H. Some pillars are partial height pillars with top pillar height J or bottom pillar height I. The distance between top plate 728 and bottom plate 726 is the heat sink span D. Pillars also have pillar angle 732 and heat transfer pillar cross-section area or distribution pillar cross-section area. These elements are as described above.

The embodiment of FIG. 9 shows heat sink 700 with flow inlet 704 attached to bottom plate 726 and flow outlet 706 attached to exterior wall 702, and heat source 731 attached to top plate 728. Distribution pillars 710 are within primary flow volume 730. Distribution pillars 710a are partial height pillars extending from bottom plate 726 toward top plate 728. Distribution pillars 710a have pillar angle 732a, which may or may not be consistent throughout flow distribution section 708a. In the embodiment of FIG. 9, distribution pillars 710a have pillar angles 732a which converge toward a point. Pillar angles 732a, in other embodiments, may also converge toward a line, diverge away from a point, diverge away from a line, or be some combination of converging, diverging, or leaning. Distribution pillars 710b are partial height pillars extending from top plate 728 toward bottom plate 726. Distribution pillars 710b have pillar angle 732b, which may or may not be consistent throughout flow distribution section 708b. In the embodiment of FIG. 9, distribution pillars 710b have pillar angles 732b which converge toward a point. Pillar angles 732b, in other embodiments, may also converge toward a line, diverge away from a point, diverge away from a line, or some combination of converging, diverging, or leaning. In further embodiments distribution pillars 710 may also be full height pillars and/or may have pillar angles of 90° (i.e., straight up and down).

Heat transfer section 712 is shown in FIG. 9 as comprising full height heat transfer pillars 714 having a height H, which is equal to the heat sink span D, and pillar angle 732c of 90°. In other embodiments, heat transfer pillars may be partial height pillars as described above, and/or may have pillar angles 732c not equal to 90°.

When in use, fluid mover 705, forces fluid through flow inlet 704. The fluid flow impinges on top plate 728. The fluid flow then continues throughout the heat sink, exiting at flow outlets 706a,b. Heat from heat source 731 is transferred to heat transfer pillars 714 and distribution pillars 710. When the fluid contacts pillars 710, 714 heat is transferred to the fluid, which then leaves the system.

Figure 10:
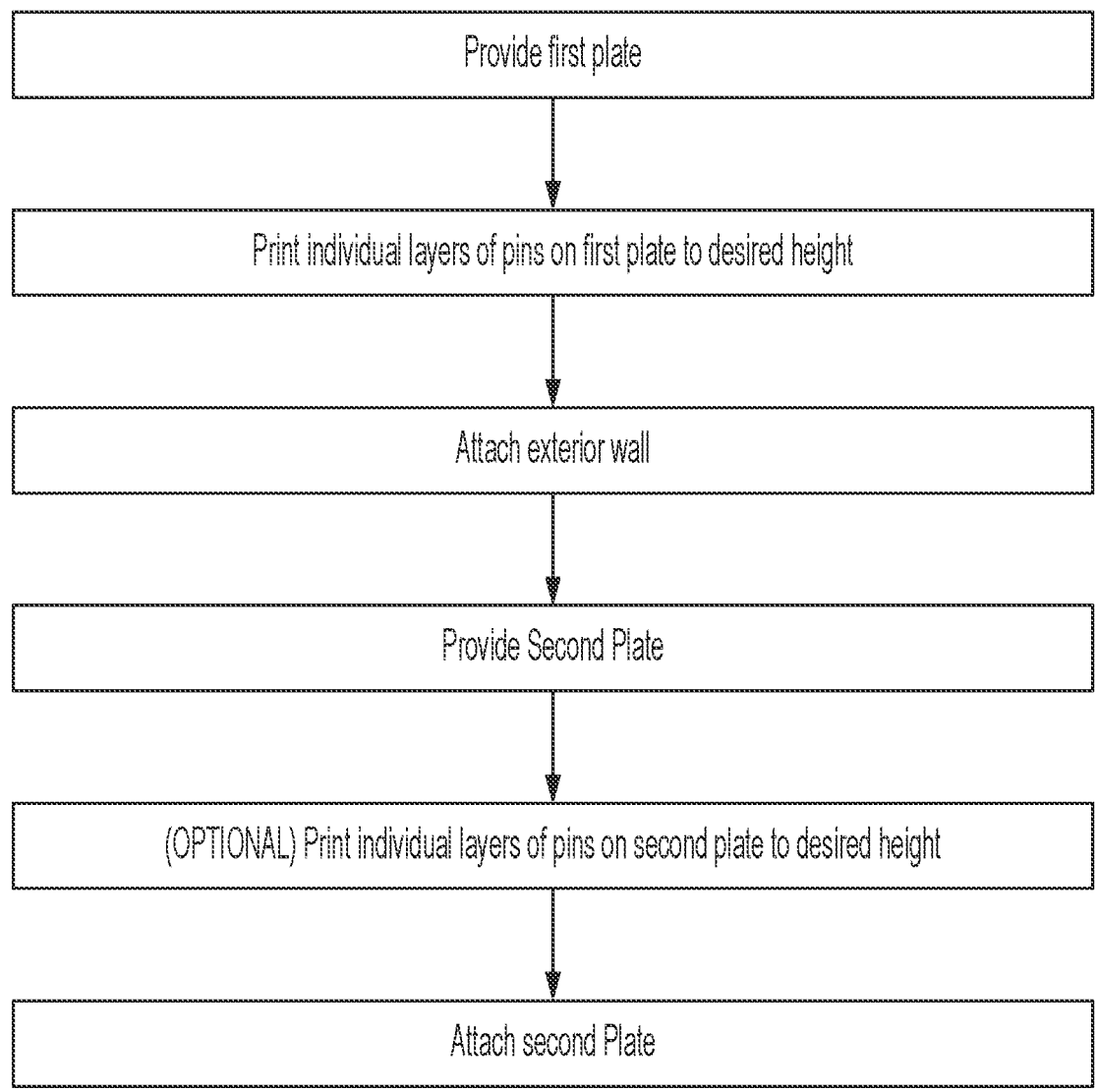
FIG. 10 is a schematic for a method of manufacturing a three-dimensional varying topology heat sink described herein.

FIG. 10 is a schematic for a method of manufacturing a three-dimensional varying topology heat sink described herein. First a first plate is provided. The first plate can be manufactured by any acceptable method, including, for example, machining, die casting, additive manufacturing, or extrusion. The first plate can comprise materials which are suitable for additive manufacturing, for example metal, ceramic, or polymers. The first plate may also comprise materials that are suitable for heat transfer. For example, the first plate can be a material with thermal conductivity of more than 130 W/mK, for example aluminum. The first plate may also include a flow inlet or outlet, as the design requires.

Next, heat transfer surfaces are built directly onto the first plate using an additive manufacturing method, for example powder bed fusion, binder jetting, or directed energy deposition. In some embodiments the first plate and the heat transfer surfaces are built using the same additive manufacturing process. In additive manufacturing methods heat transfer surfaces are built layer by layer from the first plate to the desired height. The heat transfer surfaces are made from materials which are both suitable for additive manufacture and heat transfer including, for example, metal, ceramic, or polymers. For example, the pillars may be fabricated of a material with a thermal conductivity of at least 1 W/mK, at least 130 W/mK, or at least 400 W/mk. Some pillar geometries that address the impact of pillar thermal conductivity on fin efficiency, pillars could be fabricated of materials such as polymers with lower thermal conductivity on the order of 1 W/mK.

Either simultaneous with or subsequent to the pillars being built, the exterior wall is provided. In some embodiments, the exterior wall can be built layer by layer using additive manufacturing directly onto the first plate. In other embodiments, the exterior wall can be manufactured by any acceptable method, including, for example, die casting, additive manufacturing, or extrusion, then attached to the first plate. Attachment may be accomplished by for example, welding, gluing, or fasteners. The exterior wall may also include a flow inlet, flow outlet, or both flow inlet and outlet, as the design requires.

Next a second plate is provided. The second plate can be manufactured by any acceptable method, including, for example, machining, die casting, additive manufacturing, or extrusion. In some embodiments the second plate is additively manufactured directly onto the pillars. In other embodiments, the second plate can be combined with an exterior wall that is attached to the heat sink after fins are fabricated. The second plate can comprise materials which are suitable for additive manufacturing, for example metal, ceramic, or polymers. The second plate may also comprise materials that are suitable for heat transfer. For example, the second plate can be fabricated of a low density material such as a polymer with density on the order of 2 g/cubic cm. The second plate may also include a flow inlet or outlet, as the design requires.

Finally, the second plate is attached to heat sink. Attachment may be accomplished by for example, welding, gluing, fasteners, or integral manufacturing onto the exterior wall or may be attached by directly printing onto the heat sink by additive manufacturing.

Figure 11:
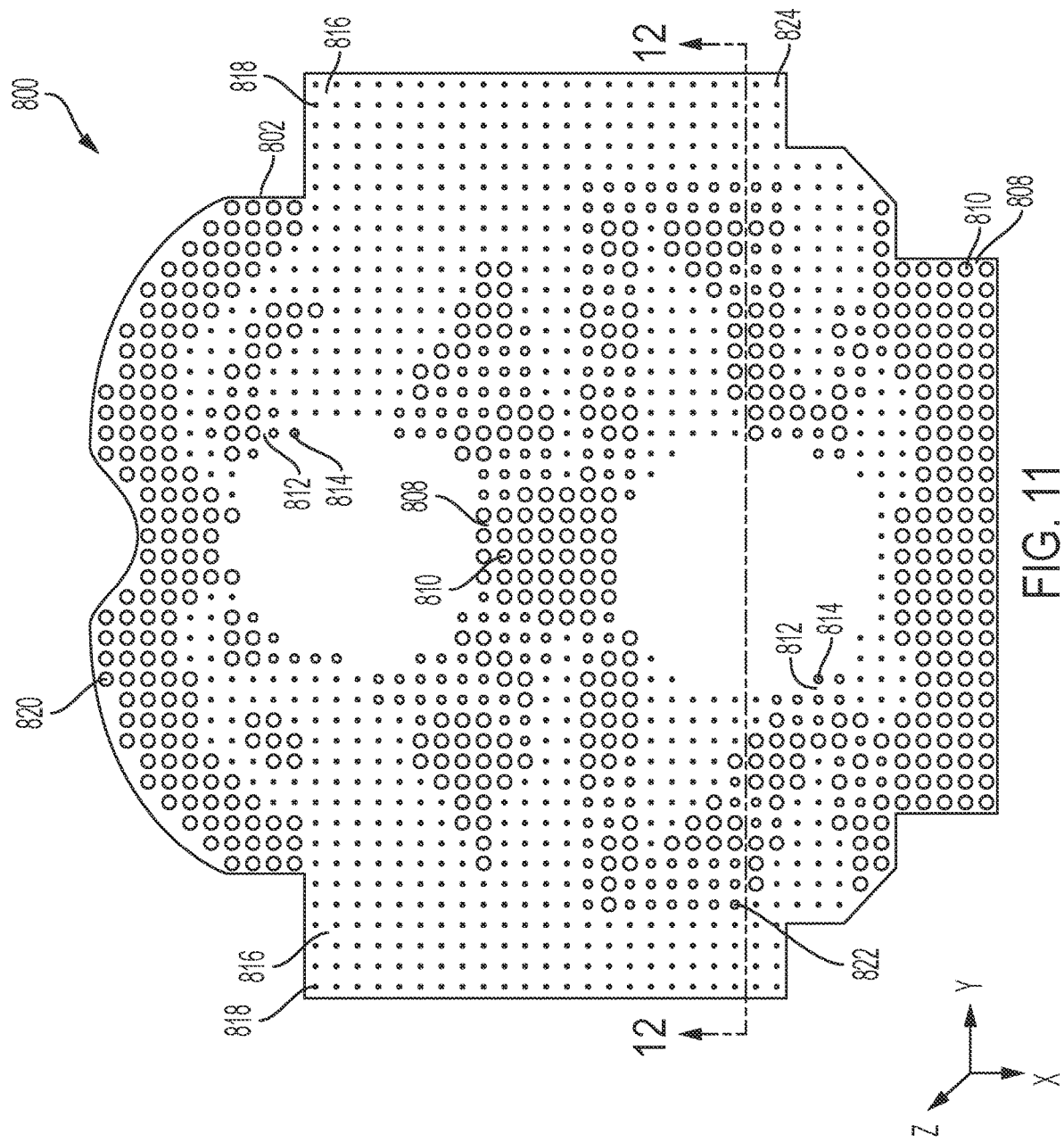
FIG. 11 is a top view of an alternate embodiment of a three-dimensional varying topology heat sink with a uniform pillar density.
Figure 12:
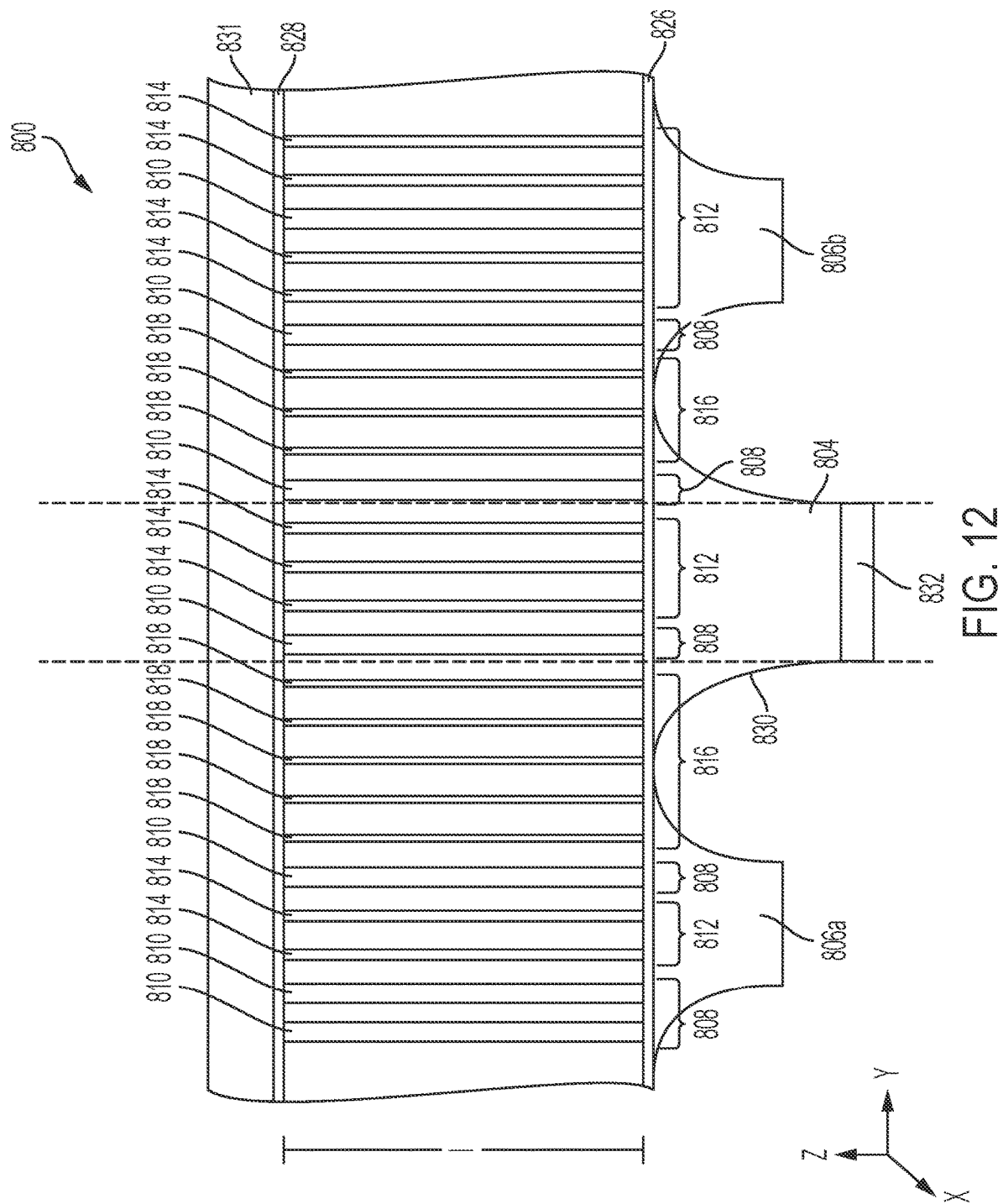
FIG. 12 is a side view of the three-dimensional varying topology heat sink of FIG. 11 taken along line B-B.

FIG. 11 is a top view of an alternate embodiment of a three-dimensional varying topology heat sink with a uniform heat transfer surface feature density. FIG. 12 is a side view of the three-dimensional varying topology heat sink of FIG. 11 taken along line B-B. Heat sink 800 includes exterior wall 802, flow inlet 804, flow outlet 806, flow distribution section 808 containing distribution pillars 810, heat transfer section 812 containing heat transfer pillars 814, flow collector section 816 containing collector pillars 818, fluid mover 832, heat source 831, and primary flow volume 830. Each distribution pillar 810 has a distribution pillar cross-section area 820. Each heat transfer pillar 814 has a heat transfer pillar cross-section area 822. Each collector pillar 818 has a collector pillar cross-section area 824.

Primary flow volume 830 is the volume through which fluid would flow were it to follow a substantially straight path after entering the heat sink. Flow distribution section 808 is a region of heat sink 800 primarily designed to direct flow through the heat sink. Heat transfer section 812 is a region of heat sink 800 primarily designed to maximize heat transfer. Flow collector section 816 is a region of heat sink 800 primarily designed to create a reservoir for fluid within heat sink 800, in order to limit pressure changes over the heat sink 800. All sections provide some heat transfer.

The outer edge of heat sink 800 is defined by exterior wall 802. Distribution pillars 810, heat transfer pillars 814, and collector pillars 818 are evenly distributed throughout the interior region of heat sink 800, i.e. the number of pillars per square centimeter is consistent throughout the interior region of heat sink 800. In the embodiment pictured, the pillars are arranged in rows and columns, though another even distribution arrangement may be used (for example staggered rows and columns). The exact location, size, and shape of flow distribution section 808, heat transfer section 812, and flow collector section 816 are determined by the desired flow properties. In some embodiments, the ratio of distribution section area 808 to heat transfer section area 812 is between 20% and 80%, between 25% and 75%, or between 30% and 70%, the ratio of heat distribution section 812 area to flow collector section 816 area is between 30% and 70%, between 35% and 65%, or between 40% and 60%, and the ratio of flow distribution section 808 area to flow collector section 816 area is between 30% and 70%, between 35% and 65%, or between 40% and 60%. In some embodiments, flow distribution section 808 and heat transfer section 812 are proximate to flow inlet 804a-b, with flow collector sections 816 proximate to exterior wall 802. The exact number of pillars in flow distribution section 808, heat transfer section 812, and flow collector section 816 is determined by the desired flow properties.

Each heat transfer pillar 814 has a heat transfer pillar cross-section area 822 and pillar height H. Each collector pillar 818 has collector pillar cross-section area 824 and pillar height H extending in the Z-direction. Distribution pillars 810, heat transfer pillars 814, and collector pillars 818 extend from bottom plate 826 to top plate 828. Distribution pillar cross-section area 820, heat transfer pillar cross-section area 822, and collector pillar cross-section area 824 are different from each other, and are determined based on the desired flow and heat transfer properties of heat sink 800. In some embodiments, the ratio of distribution pillar cross-section area 820 to heat transfer pillar cross-section area 822 is between 20% and 80%, between 25% and 75%, or between 30% and 70%, the ratio of heat transfer pillar cross-section area 822 to collector pillar cross-section area 824 is between 20% and 80%, between 25% and 75%, or between 30% and 70%, and the ratio of distribution pillar cross-section area 820 to collector pillar cross-section area 824 is between 30% and 70%, between 35% and 65%, or between 40% and 60%.

Similar to the embodiment in FIG. 9, when in use, fluid mover 832, forces fluid through flow inlet 804. The fluid flow impinges on top plate 828. The fluid flow then continues through the heat sink, exiting at flow outlets 806a-b. Heat from heat source 831 is transferred to heat transfer pillars 814, distribution pillars 810, and collector pillars 818. When the fluid contacts pillars 810, 814, 818, heat is transferred to the fluid, which then leaves the system through flow outlets 806a-b. Outlets 806 a-b are offset 180° from the inlet, i.e. they are on the same side of heat sink 800 as inlet 804. The pictured embodiment has two inlets and two outlets, but any number of inlets and outlets may be used. In various embodiments, the outlets may be arranged so that a flow outlet volume has a length that is at an angle between 45 degrees and 180 degrees, inclusive, relative to the length of the primary flow volume 830.

Figure 13:
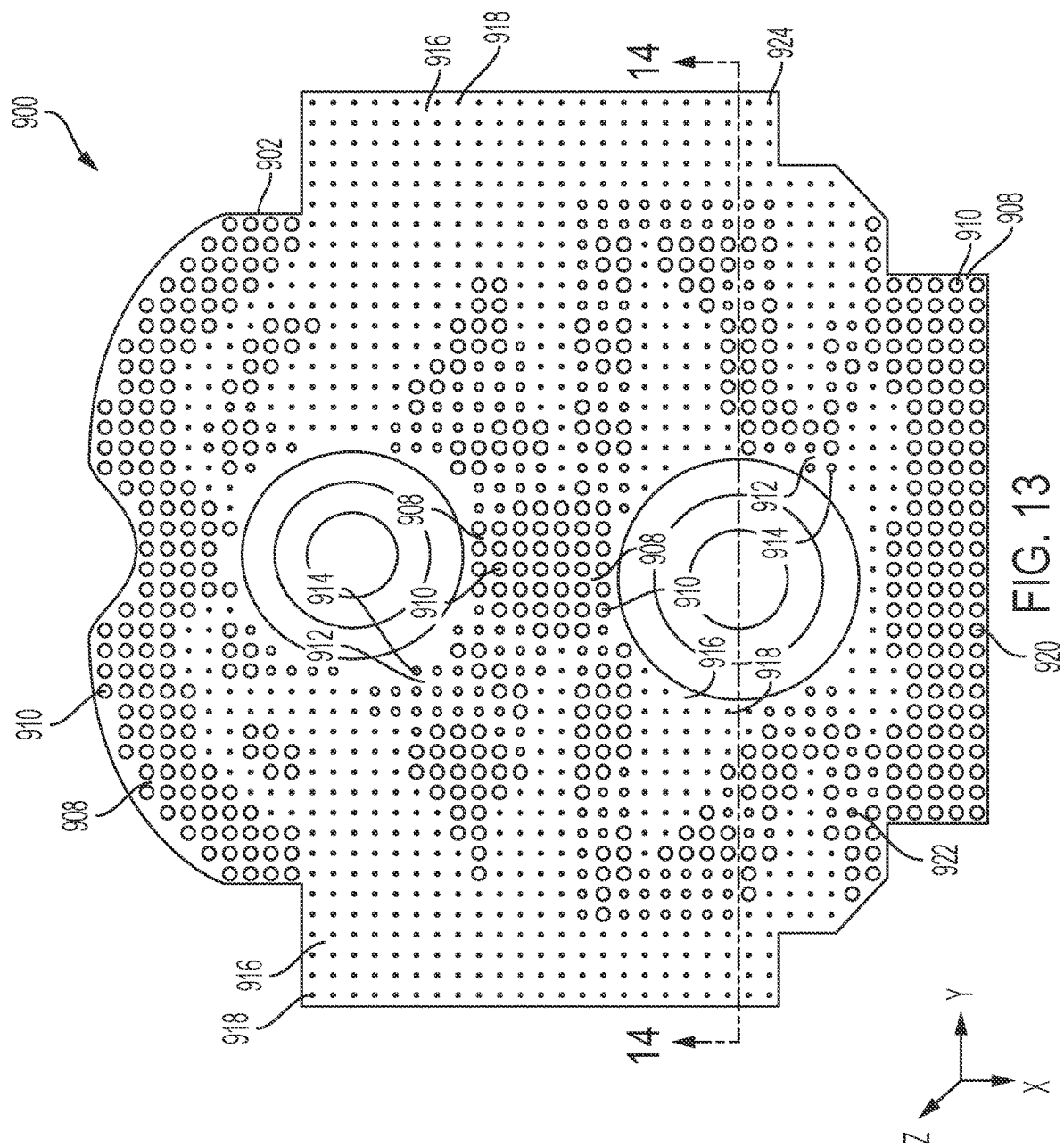
FIG. 13 is a top view of an alternate embodiment of a three-dimensional varying topology heat sink with a uniform pillar density.
Figure 14:
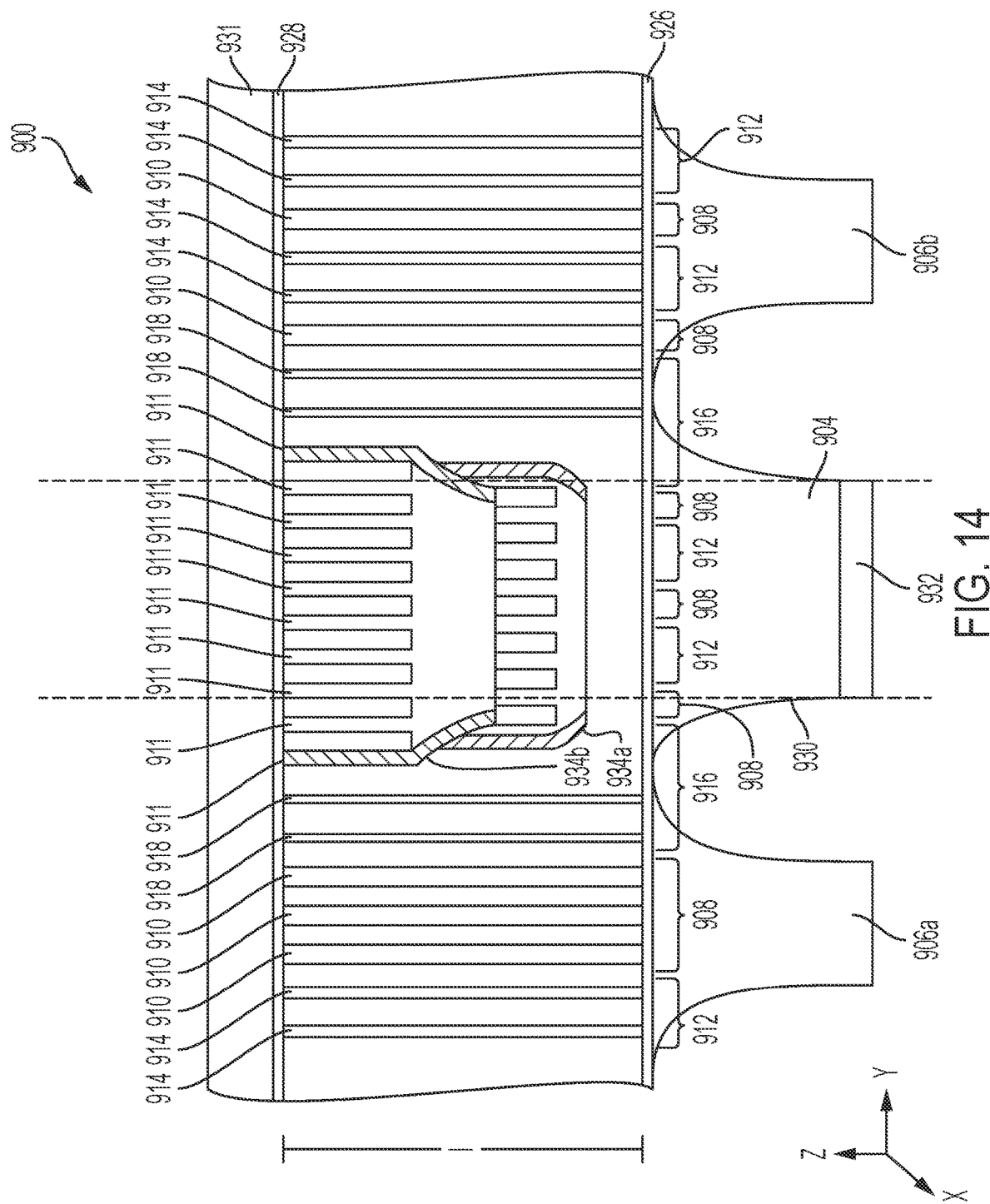
FIG. 14 is a side view of the three-dimensional varying topology heat sink of FIG. 13 taken along line C-C.

FIG. 13 is a top view of an alternate embodiment of a three-dimensional varying topology heat sink with a uniform pillar density. FIG. 14 is a side view of the three-dimensional varying topology heat sink of FIG. 13 taken along line C-C. Heat sink 900 includes exterior wall 902, flow inlet 904, flow outlet 906, flow distribution section 908 containing distribution pillars 910, heat transfer section 912 containing heat transfer pillars 914, flow collector section 916 containing collector pillars 918, flow distribution vanes 934, fluid mover 932, heat source 931, and primary flow volume 930. Each distribution pillar 910 has a distribution pillar cross-section area 920. Each heat transfer pillar 914 has a heat transfer pillar cross-section area 922. Each collector pillar 918 has a collector pillar cross-section area 924.

Primary flow volume 930 is the volume through which fluid would flow were it to follow a substantially straight path after entering the heat sink. Flow distribution section 908 is a region of heat sink 900 primarily designed to direct flow throughout the heat sink. Heat transfer section 912 is a region of heat sink 900 primarily designed to maximize heat transfer. Flow collector section 916 is a region of heat sink 900 primarily designed to create a reservoir for fluid within heat sink 900, in order to limit pressure changes over the heat sink 900. All sections provide some heat transfer.

The outer edge of heat sink 900 is defined by exterior wall 902. Distribution pillars 910, heat transfer pillars 914, and collector pillars 918 are evenly distributed throughout the interior region of heat sink 900, i.e. the number of pillars per square centimeter is consistent throughout the interior region of heat sink 900. In the embodiment pictured, the pillars are arranged in rows and columns, though another patterned distribution arrangement may be used (for example staggered rows and columns). The exact location, size, and shape of flow distribution section 908, heat transfer section 912, and flow collector section 916 are determined by the desired flow properties. In some embodiments, the ratio of distribution section area 908 to heat transfer section area 912 is between 20% and 80%, between 25% and 75%, or between 30% and 70%, the ratio of heat distribution section 912 area to flow collector section 916 area is between 30% and 70%, between 35% and 65%, or between 40% and 60%, and the ratio of flow distribution section 908 area to flow collector section 916 area is between 30% and 70%, between 35% and 65%, or between 40% and 60%. In some embodiments, flow distribution section 908 and heat transfer section 912 are proximate to flow inlet 904a-b, with flow collector sections 916 proximate to exterior wall 902. The exact number of pillars in flow distribution section 908, heat transfer section 912, and flow collector section 916 is determined by the desired flow properties.

Each distribution pillar 910 has a distribution pillar cross-section area 920 and pillar height H. Each heat transfer pillar 914 has a heat transfer pillar cross-section area 922 and pillar height H. Each collector pillar 918 has collector pillar cross-section area 924 and pillar height H extending in the Z-direction. Distribution pillars 910, heat transfer pillars 914, and collector pillars 918 extend from bottom plate 926 to top plate 928. Distribution pillar cross-section area 920, heat transfer pillar cross-section area 922, and collector pillar cross-section area 924 are different from each other, and are determined based on the desired flow and heat transfer properties of heat sink 900. In some embodiments, the ratio of distribution pillar cross-section area 920 to heat transfer pillar cross-section area 922 is between 20% and 80%, between 25% and 75%, or between 30% and 70%, the ratio of heat transfer pillar cross-section area 922 to collector pillar cross-section area 924 is between 20% and 80%, between 25% and 75%, or between 30% and 70%, and the ratio of distribution pillar cross-section area 920 to collector pillar cross-section area 924 is between 30% and 70%, between 35% and 65%, or between 40% and 60%.

Flow distribution vanes 934a-b are vanes as described above which are designed to direct fluid flow through the heat sink. In the embodiment of FIGS. 13-14 flow distribution vanes are integrally manufactured with the underlying partial height pillars 911. Flow distribution vanes 934a-b have a vane angle 936 defined as the angle between top plate 928 and the tangent of flow distribution vane 934a-b at the point nearest top plate 928. Vane angle 936 can be between 10 degrees and 90 degrees in reference to the bottom plate, and between 15 degrees and 85 degrees in reference to the bottom plate in some embodiments. In the embodiment of FIG. 14, flow distribution vanes 934 have vane angles 936 which diverge from a point on bottom plate 926. Vane angles 934a-b, in other embodiments, may also diverge from a line, converge toward a point, converge toward a line, or be some combination of converging, diverging, or leaning. The profile of flow distribution vane can be varied to suit the desired flow properties. In FIG. 14, for example, flow distribution vane 934a has a convex profile, while flow distribution vane 934b has a concave profile.

Similar to the embodiment in FIGS. 11-12, when in use, fluid mover 932, forces fluid through flow inlet 904. Flow distribution vanes 934a-b direct the flow and the fluid flow impinges on top plate 928. The fluid flow then continues throughout the heat sink, exiting at flow outlets 906a-b. Heat from heat source 931 is transferred to heat transfer pillars 914, distribution pillars 910, and collector pillars 918. When the fluid contacts pillars 910, 914, 918, heat is transferred to the fluid, which then leaves the system through flow outlets 906a-b. Outlets 906 a-b are offset 180° from the inlet, i.e. they are on the same side of heat sink 900 as inlet 904. The pictured embodiment has two inlets and two outlets, but any number of inlets and outlets may be used. In various embodiments, the outlets may be arranged so that a flow outlet volume has a length that is at an angle between 45 degrees and 180 degrees, inclusive, relative to the length of the primary flow volume 930.

Discussion of Possible Embodiments

The following are non-exclusive descriptions of possible embodiments of the present invention.

A heat sink including a primary flow volume having a primary flow volume cross-section, and length; a flow inlet having an inlet cross-section, the inlet cross-section defining the primary flow volume cross-section, wherein the length of the primary flow volume extends into the heat sink at a right angle to the inlet cross-section; a flow outlet outside of the primary flow volume; a bottom plate; a top plate; a flow distribution section proximate to the flow inlet comprising distribution pillars extending from at least one of the bottom plate or the top plate in a pillar length direction, each distribution pillar having a distribution cross-section taken perpendicular to the pillar length direction; a heat transfer section proximate to the flow distribution section comprising heat transfer pillars extending from at least one of the bottom plate or the top plate in the pillar length direction, each heat transfer pillar having a heat transfer cross-section taken perpendicular to the pillar length direction; a flow collector section proximate to the heat transfer section comprising collector pillars extending from at least one of the bottom plate or the top plate in the pillar length direction, each collector pillar having a collector cross-section taken perpendicular to the pillar length direction; and flow paths between the distribution pillars, heat transfer pillars, and collector pillars; wherein the distribution cross-section is greater than the heat transfer cross-section and the collector cross-section is greater than the heat transfer cross-section; and wherein the flow paths extend outside of the primary flow volume.

The heat sink of the preceding paragraph can optionally include, additionally and/or alternatively, any one or more of the following features, configurations and/or additional components.

A further embodiment of the foregoing heat sink further including a flow outlet volume having a flow outlet cross-section and flow outlet length, wherein the flow outlet has an outlet cross-section defining the flow outlet cross-section, the flow outlet length of the flow outlet volume extends into the heat sink at a right angle to a plane defined by the flow outlet cross-section, and the length of the flow outlet volume is at an angle between 45 degrees and 180 degrees relative to the length of the primary flow volume.

A further embodiment of any of the foregoing heat sinks wherein the flow paths extend outside of the primary flow volume in three dimensions.

A further embodiment of any of the foregoing heat sinks wherein the flow inlet is located on the bottom plate.

A further embodiment of any of the foregoing heat sinks further including a sidewall extending from the bottom plate to the top plate, wherein the flow outlet is located on the sidewall or the bottom plate.

A further embodiment of any of the foregoing heat sinks further including flow channel vanes, each flow channel vane having a vane height, a vane width, and a vane length, wherein the vane height extends from at least one of the bottom plate or the top plate, and wherein the vane height and the vane length are greater than the vane width.

A further embodiment of any of the foregoing heat sinks wherein the flow channel vanes each have a vane angle measured relative to the bottom plate between 10 degrees and 90 degrees.

A further embodiment of any of the foregoing heat sinks wherein the flow channel vanes are angled into the primary flow volume.

A further embodiment of any of the foregoing heat sinks wherein the distribution pillars have a uniform distribution pillar density, the heat transfer pillars have a uniform heat transfer pillar density, and the collector pillars have a uniform collector pillar density.

A further embodiment of any of the foregoing heat sinks wherein the distribution pillar density, the heat transfer pillar density, and the collector pillar density are substantially equal.

A further embodiment of any of the foregoing heat sinks wherein a plurality of at least one of the distribution pillars, heat transfer pillars, and/or collector pillars have a protrusion height, wherein the heat sink comprises a heat sink height measured from the bottom plate to the top plate, and wherein the protrusion height is less than the heat sink height.

A further embodiment of any of the foregoing heat sinks wherein at least one of the distribution pillar diameter, the heat transfer pillar diameter, or the collector pillar diameter varies in the pillar length direction.

A further embodiment of any of the foregoing heat sinks wherein a cross section of at least one of the distribution pillars, the heat transfer pillars, or the collector pillars, taken perpendicular to the pillar length direction is a circle, ellipse, tear drop or airfoil shape.

A further embodiment of any of the foregoing heat sinks wherein the pillar length direction of at least one of the distribution pillars, the heat transfer pillars, or the collector pillars forms a pillar angle between 45 degrees and 80 degrees relative to the bottom plate.

A further embodiment of any of the foregoing heat sinks wherein the pillar angle of at least one of the distribution pillars, the heat transfer pillars, or the collector pillars varies in the pillar length direction.

A further embodiment of any of the foregoing heat sinks further including a fluid mover proximate to the flow inlet configured to force air into the flow distribution section.

A further embodiment of any of the foregoing heat sinks wherein at least one of the distribution pillar, the heat transfer pillar, or the collector pillar comprises metal, ceramic, polymer, or a combination thereof.

A method for making any of the foregoing heat sinks, the method including: providing the bottom plate; building one or more of the distribution pillars, heat transfer pillars, or collector pillars onto the bottom plate layer by layer using additive manufacturing, providing the exterior wall, attaching the exterior wall to the bottom plate, providing the top plate, and attaching the top plate to one or more of the exterior wall, the distribution pillars, the heat transfer pillars, or the collector pillars.

The method of the preceding paragraph can optionally include, additionally and/or alternatively, any one or more of the following features, configurations and/or additional components.

A further embodiment of the foregoing method wherein the bottom plate is manufactured layer by layer using additive manufacturing.

A further embodiment of any of the foregoing methods wherein the exterior wall is provided and attached by building it layer by layer onto the bottom plate by an additive manufacturing method.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A heat sink comprising:
   a primary flow volume having a primary flow volume cross-section and a length;
   a flow inlet having an inlet cross-section, the inlet cross-section defining the primary flow volume cross-section, wherein the length of the primary flow volume extends into the heat sink at a right angle to the inlet cross section;
   a flow outlet outside of the primary flow volume;
   a bottom plate;
   a top plate;
   a plurality of pillars, each of the plurality of pillars being defined by a pillar center, wherein the pillar centers are distributed substantially uniformly across at least one of the bottom plate or the top plate;
   a flow distribution section proximate to the flow inlet comprising a first subset of the plurality of pillars defined as distribution pillars extending from at least one of the bottom plate or the top plate in a pillar length direction, each distribution pillar having a distribution cross-section taken perpendicular to the pillar length direction;
   a heat transfer section proximate to the flow distribution section comprising a second subset of the plurality of pillars defined as heat transfer pillars extending from at least one of the bottom plate or the top plate in the pillar length direction, each heat transfer pillar having a heat transfer cross-section taken perpendicular to the pillar length direction, the heat transfer pillars comprising:
      first pillars disposed downstream of the flow inlet, the first pillars having a first pillar diameters;
      second pillars disposed downstream of the first pillars, the second pillars having a second pillar diameter greater than the first pillar diameter; and
      third pillars disposed downstream of the second pillars, the second pillars having a third diameter less than the second pillar diameter;
   a flow collector section proximate to the heat transfer section comprising a third subset of the plurality of pillars defined as collector pillars extending from at least one of the bottom plate or the top plate in the pillar length direction, each collector pillar having a collector cross-section taken perpendicular to the pillar length direction; and
   flow paths between the distribution pillars, heat transfer pillars, and collector pillars;
   wherein the distribution cross-section is greater than the heat transfer cross-section and the collector cross-section is greater than the heat transfer cross-section; and
   wherein the flow paths extend outside of the primary flow volume.

2. The heat sink of claim 1 further comprising a flow outlet volume having a flow outlet cross-section and flow outlet length;
   wherein the flow outlet has an outlet cross-section defining the flow outlet cross-section, wherein the flow outlet length of the flow outlet volume extends into the heat sink at a right angle to a plane defined by the flow outlet cross-section; and
   wherein the length of the flow outlet volume is at an angle between 45 degrees and 180 degrees relative to the length of the primary flow volume.

3. The heat sink of claim 1 wherein the flow paths extend outside of the primary flow volume in three dimensions.

4. The heat sink of claim 1 wherein the flow inlet is located on the bottom plate.

5. The heat sink of claim 4 further comprising a sidewall extending from the bottom plate to the top plate;
wherein the flow outlet is located on the sidewall or the bottom plate.

6. The heat sink of claim 1 further comprising flow channel vanes, each flow channel vane having a vane height, a vane width, and a vane length;
wherein the vane height extends from at least one of the bottom plate or the top plate; and
wherein the vane height and the vane length are greater than the vane width.

7. The heat sink of claim 6 wherein the flow channel vanes each have a vane angle measured relative to the bottom plate between 10 degrees and 90 degrees.

8. The heat sink of claim 7 wherein the flow channel vanes are angled into the primary flow volume.

9. The heat sink of claim 1 wherein the distribution pillars have a uniform distribution pillar density, the heat transfer pillars have a uniform heat transfer pillar density, and the collector pillars have a uniform collector pillar density.

10. The heat sink of claim 9 wherein the distribution pillar density, the heat transfer pillar density, and the collector pillar density are substantially equal.

11. The heat sink of claim 1 wherein a plurality of at least one of the distribution pillars, heat transfer pillars, and/or collector pillars have a protrusion height;
wherein the heat sink comprises a heat sink height measured from the bottom plate to the top plate; and
wherein the protrusion height is less than the heat sink height.

12. The heat sink of claim 1 wherein at least one of the distribution pillar diameter, the heat transfer pillar diameter, or the collector pillar diameter varies in the pillar length direction.

13. The heat sink of claim 1 wherein a cross section of at least one of the distribution pillars, the heat transfer pillars, or the collector pillars, taken perpendicular to the pillar length direction is a circle, ellipse, tear drop or airfoil shape.

14. The heat sink of claim 1 wherein the pillar length direction of at least one of the distribution pillars, the heat transfer pillars, or the collector pillars forms a pillar angle between 45 degrees and 80 degrees relative to the bottom plate.

15. The heat sink of claim 14 wherein the pillar angle of at least one of the distribution pillars, the heat transfer pillars, or the collector pillars varies in the pillar length direction.

16. The heat sink of claim 1 further comprising a fluid mover proximate to the flow inlet configured to force air into the flow distribution section.

17. The heat sink of claim 1 wherein at least one of the distribution pillar, the heat transfer pillar, or the collector pillar comprises metal, ceramic, polymer, or a combination thereof.

18. A method for making the heat sink of claim 1, the method comprising:
providing the bottom plate;
building one or more of the distribution pillars, heat transfer pillars, or collector pillars onto the bottom plate layer by layer using additive manufacturing,
providing the exterior wall,
attaching the exterior wall to the bottom plate,
providing the top plate,
attaching the top plate to one or more of the exterior wall, the distribution pillars, the heat transfer pillars, or the collector pillars.

19. The method of claim 18 wherein the bottom plate is manufactured layer by layer using additive manufacturing.

20. The method of claim 18 wherein the exterior wall is provided and attached by building it layer by layer onto the bottom plate by an additive manufacturing method.

* * * * *